United States Patent
Hsu

(10) Patent No.: US 8,906,838 B2
(45) Date of Patent: Dec. 9, 2014

(54) MICROELECTRONIC CLEANING AND ARC REMOVER COMPOSITIONS

(75) Inventor: Chien-Pin Sherman Hsu, Basking Ridge, NJ (US)

(73) Assignee: Avantor Performance Materials, Inc., Center Valley, PA (US)

( * ) Notice: Subject to any disclaimer, the term of this patent is extended or adjusted under 35 U.S.C. 154(b) by 2600 days.

(21) Appl. No.: 10/515,372

(22) PCT Filed: May 27, 2003

(86) PCT No.: PCT/US03/16829
§ 371 (c)(1),
(2), (4) Date: Nov. 22, 2004

(87) PCT Pub. No.: WO03/104901
PCT Pub. Date: Dec. 18, 2003

(65) Prior Publication Data
US 2005/0176602 A1    Aug. 11, 2005

Related U.S. Application Data

(60) Provisional application No. 60/386,800, filed on Jun. 7, 2002, provisional application No. 60/401,688, filed on Aug. 7, 2002.

(51) Int. Cl.
| | | |
|---|---|---|
| *C11D 3/39* | (2006.01) | |
| *C23G 1/06* | (2006.01) | |
| *G03F 7/42* | (2006.01) | |
| *H05K 3/26* | (2006.01) | |
| *C11D 11/00* | (2006.01) | |

(52) U.S. Cl.
CPC ............ *C23G 1/061* (2013.01); *C11D 11/0047* (2013.01); *G03F 7/425* (2013.01); *H05K 3/26* (2013.01); *H05K 2203/0783* (2013.01); *H05K 2203/121* (2013.01); *H05K 2203/122* (2013.01)
USPC ............................. 510/175; 510/176; 134/1.3

(58) Field of Classification Search
CPC .................................................... C11D 11/0047
USPC ..................... 510/175, 176; 134/1.3
See application file for complete search history.

(56) References Cited

U.S. PATENT DOCUMENTS

| | | | |
|---|---|---|---|
| 3,673,099 A | 6/1972 | Corby et al. ................... 252/156 |
| 4,744,834 A | 5/1988 | Haq .................................. 134/38 |
| 5,037,724 A | 8/1991 | Maeda et al. | |
| 5,308,745 A | 5/1994 | Schwartzkopf | |
| 5,561,105 A * | 10/1996 | Honda ........................... 510/178 |
| 5,962,385 A * | 10/1999 | Maruyama et al. ........... 510/176 |
| 5,972,862 A * | 10/1999 | Torii et al. ..................... 510/175 |
| 6,261,745 B1 * | 7/2001 | Tanabe et al. ................. 430/331 |
| 6,265,309 B1 * | 7/2001 | Gotoh et al. .................. 438/637 |
| 6,274,296 B1 * | 8/2001 | Chu ................................ 430/331 |
| 6,323,169 B1 * | 11/2001 | Abe et al. ....................... 510/176 |
| 6,367,486 B1 * | 4/2002 | Lee et al. ......................... 134/1.3 |
| 6,379,875 B2 * | 4/2002 | Chu ................................ 430/329 |
| 6,475,966 B1 * | 11/2002 | Sahbari ......................... 510/175 |
| 6,531,436 B1 * | 3/2003 | Sahbari et al. ................ 510/176 |
| 6,773,873 B2 * | 8/2004 | Seijo et al. .................... 430/329 |
| 2002/0037819 A1 * | 3/2002 | Sahbari ......................... 510/175 |
| 2003/0181342 A1 * | 9/2003 | Seijo et al. .................... 510/175 |

* cited by examiner

*Primary Examiner* — Gregory Webb
(74) *Attorney, Agent, or Firm* — Hoffmann & Baron, LLP

(57) ABSTRACT

Cleaning compositions suitable for cleaning microelectronic structures having silicon dioxide, low-k or high-k di-electrics and copper or aluminum metallizations contain a polar organic solvent selected from amides, sulfones, sulfolenes, selenones and saturated alcohols and a strong alkaline base.

14 Claims, No Drawings

MICROELECTRONIC CLEANING AND ARC REMOVER COMPOSITIONS

This application is National Stage Entry of PCT/US03/16829, filed May 27, 2003, which claims priority from Provisional Application No. 60/401,688, filed on Aug. 7, 2002, and Provisional Application No. 60/386,800, filed on Jun. 7, 2002.

FIELD OF THE INVENTION

This invention relates to methods and cleaning compositions for cleaning microelectronic substrates, and particularly to such cleaning compositions useful with and having improved compatibility with microelectronic substrates characterized by silicon dioxide, sensitive low-κ or high-κ dielectrics and copper metallization, as well as substrates of Al or Al(Cu) metallizations. The invention also relates to the use of such cleaning compositions for stripping photoresists, cleaning residues from plasma process generated organic, organometallic and inorganic compounds, cleaning residues from planarization processes such as chemical mechanical polishing (CMP), and used as an additive in planarization slurry residues.

BACKGROUND TO THE INVENTION

Many photoresist strippers and residue removers have been proposed for use in the microelectronics field as downstream or back end of the manufacturing line cleaners. In the manufacturing process a thin film of photoresist is deposited on a wafer substrate, and then circuit design is imaged on the thin film. Following baking, the unpolymerized resist is removed with a photoresist developer. The resulting image is then transferred to the underlying material, which is generally a dielectric or metal, by way of reactive plasma etch gases or chemical etchant solutions. The etchant gases or chemical etchant solutions selectively attack the photoresist-unprotected area of the substrate. As a result of the plasma etching process, photoresist, etching gas and etched material by-products are deposited as residues around or on the sidewall of the etched openings on the substrate.

Additionally, following the termination of the etching step, the resist mask must be removed from the protected area of the wafer so that the final finishing operation can take place. This can be accomplished in a plasma ashing step by the use of suitable plasma ashing gases or wet chemical strippers. Finding a suitable cleaning composition for removal of this resist mask material without adversely affecting, e.g., corroding, dissolving or dulling, the metal circuitry has also proven problematic.

As microelectronic fabrication integration levels have increased and patterned microelectonic device dimensions have decreased, it has become increasingly common in the art to employ copper metallizations, low-κ and high-κ dielectrics. These materials have presented additional challenges to find acceptable cleaner compositions. Many process technology compositions that have been previously developed for "traditional" or "conventional" semiconductor devices containing Al/SiO$_2$ or Al(Cu)/SiO$_2$ structures cannot be employed with copper metallized low-κ or high-κ dielectric structures. For example, hydroxylamine based stripper or residue remover compositions are successfully used for cleaning devices with Al metallizations, but are practically unsuitable for those with copper metallizations. Similarly, many copper metallized/low-κ strippers are not suitable for Al metallized devices unless significant adjustments in the compositions are made.

Removal of these etch and/or ash residues following the plasma etch and/or ashing process has proved problematic. Failure to completely remove or neutralize these residues can result in the absorption of moisture and the formation of undesirable materials that can cause corrosion to the metal structures. The circuitry materials are corroded by the undesirable materials and produce discontinuances in the circuitry wiring and undesirable increases in electrical resistance.

The current back end cleaners show a wide range of compatibility with certain, sensitive dielectrics and metallizations, ranging from totally unacceptable to marginally satisfactory. Many of the current strippers or residue cleaners are not acceptable for advanced interconnect materials such as porous and low-κ dielectrics and copper metallizations. Additionally, the typical alkaline cleaning solutions employed are overly aggressive towards porous and low-κ and high-κ dielectrics and/or copper metallizations. Moreover, many of these alkaline deaning compositions contain organic solvents that show poor product stability, especially at higher pH ranges and at higher process temperatures.

Heretofore, oxidizers have been used in cleaning compositions in primarily aqueous form. Oxidizers, such as the commonly used hydrogen peroxide and peracids, are known to react readily or decompose easily, especially in organic solvent matrices that have been generally employed in stripping compositions. In such instances the oxidizing agent is consumed and becomes unavailable for its intended use. Additionally, microelectronic cleaning compositions containing oxidizers often show poor product stability, especially in the presence of significant amounts of 10 wt % or more of organic solvents, and at higher pH ranges and high process temperatures. Furthermore, in many compositions the use of stabilizers and solvents often tie up the oxidizing agent resulting in diminished capabilities of performing effective oxidation/reduction reactions employed in the cleaning process.

BRIEF SUMMARY OF THE INVENTION

There is, therefore, a need for organic solvent based microelectronic cleaning compositions that are stable in strong alkaline conditions of pH >9, at high temperatures of 60° C. or greater, and in the presence of strong oxidizing agents such as hydrogen peroxide and the like and that are suitable for back end cleaning operations, which compositions are effective cleaners and are applicable for stripping photoresists and cleaning residues from plasma process generated organic, organometallic and inorganic compounds, cleaning residues from planarization processes, such as CMP, and useful as additives in planarization slurry/liquids and which can be used for advanced interconnect materials employing copper metallizations, and porous or non-porous low-κ (i.e., a κ value of 3 or less) or high-κ (i.e., a κ value of 20 or greater) dielectrics as well as useful for cleaning conventional devices, such as those with aluminum or aluminum(copper) metallizations containing silicon dioxide, low-κ or high-κ dielectrics. This invention also relates to such compositions than can be combined with an oxidizing agent to provide cleaning compositions that are also effective cleaners for cleaning all such devices.

It has been discovered that silicate free formulations containing strong alkaline bases and certain polar organic solvents that are minimally or non-reactive with the oxidizing agents and especially those solvents which help to stabilize the oxidizing agents can provide such widely acceptable cleaning compositions. It has been discovered that solvents with good hydrogen bonding capability provide such formulations. The cleaning composition of this invention will generally have from about 0.1 to about 30 wt % of strong alkaline base and from about 1 to about 99.9 wt % of the organic polar solvent with good hydrogen bonding capability. The cleaning compositions of this invention can also optionally contain water and/or compatible acids or alkaline bases, chelating agents, co-solvents, oxidizing agent stabilizing agents, metal corrosion inhibitors, surfactants, and fluoride compounds. The wt percentages provided in this specification are based on the total weight of the cleaning composition.

DETAILED DESCRIPTION OF THE INVENTION AND PREFERRED EMBODIMENTS

The novel back end cleaning composition of this invention will comprise one or more of any strong alkaline base and certain polar organic solvents. The cleaning compositions can be formulated into highly aqueous, semi-aqueous or organic solvent based formulations. The cleaning compositions can be used alone with other solvents only, or can be combined with bases and acids. The cleaning compositions of this invention can be used over a wide range of process/operating conditions of pH and temperature, and can be used to effectively remove photoresists, post plasma etch/ash residues, sacrificial light absorbing materials and anti-reflective coatings (ARC). Additionally, it has been discovered that every difficult to clean samples, such as highly crosslinked or hardened photoresists and structures which contain titanium (such as titanium, titanium oxide and titanium nitride) or tantalums (such as tantalum, tantalum oxide and tantalum nitride) can be readily cleaned with the cleaning compositions of this invention.

The alkaline base can be present in an amount of from 0.1 to about 30 wt %, preferably in an amount of from about 0.1 to about 10 wt %, most preferably in an amount of from about 0.1 to about 5 wt %. Any suitable alkaline base may be employed in the cleaning compositions. The base is preferably ammonia hydroxide or an ammonia or non-ammonia derived base. When the composition is intended to be used to clean copper metallized structures the base is preferably a non-ammonia derived base and when the composition is intended to be used to clean aluminum containing structures the alkaline base is preferably ammonium hydroxide, a ammonia derived base, or a non-ammonia derived base in combination with a corrosion-inhibiting co-solvent and/or corrosion-inhibiting agent, as disclosed hereinafter. As examples of suitable non-ammonia derived bases there may be mentioned tetraalkylammonium hydroxides such as those of the formula $R_4N^+OH^-$ where each R is independently a substituted or unsubstituted alkyl groups, preferably of 1 to 22 carbon atoms and more preferably 1 to 4 carbon atoms. Among the non-ammonia derived alkaline bases useful in the compositions there may be mentioned, for example, tetramethylammonium hydroxide, tertrabutylammonium hydroxide, choline hydroxide, and the like. Inorganic bases such as for example potassium hydroxide, sodium hydroxide and the like may also be used as the alkaline base.

The organic solvent is a polar organic solvent with hydrogen bonding capability and which is minimally or non-reactive with the oxidizing agent. Such organic solvents include amides, sulfones, sulfolenes, selenones, and saturated alcohols. Among the preferred solvents there may be mentioned sulfolane (tetrahydrothiopene-1,1-dioxide), 3-methylsulfolane, n-propyl sulfone, n-butyl sulfone, sulfolene (2,5dihydrothiopene-1,1-dioxide), 3methylsulfolene, amides such as 1-(2-hydroxyethyl)-2-pyrrolidinone (HEP), dimethylpiperidone (DMPD), N-methyl pyrrolidinone (NMP), and dimethylacetamide (DMAc), dimethylformamide (DMF), and saturated alcohols such as ethanol, propanol, butanol, hexanol, ethylene glycol, propylene glycol, glycerol, and hexafluoroisopropanol. The organic solvent component can include one or more of the solvents and is generally present in the composition in an amount of from about 1 to about 99.9 wt %, preferably in an amount of from about 10 to about 90 wt %, and most preferably in an amount of from about 30 to 80 wt %. These solvents are resistant to acidic and alkaline conditions and will not bind with oxidizing agents too tightly. Additionally, when the formulation of this invention are combined with a oxidizing agent they are capable of stabilizing the oxidizing agent, such as hydrogen peroxide, by forming stable complexes through interaction such as hydrogen bonding.

Water can be present in the cleaning composition and when present can be present in an amount of from about 0.1 to about 98 wt %, preferably in an amount of from about 10 to about 60 wt %, most preferably in an amount of from about 15 to about 50 wt %. The water can be present as part of the aqueous portion of the other components and/or as additional added water.

An indicated before, the cleaning composition of this invention can also be employed under acid pH conditions and any suitable acid component can be employed in the necessary amount sufficient to provide the acidic pH to the composition, such as for example HCl or HF.

The cleaning composition may also optionally include one or more corrosion-inhibiting co-solvents. Preferred corrosion-inhibiting co-solvents useful in the compositions of this invention are those of the general formula $$W-[CR_1R_2]_n-Y$$

where $R_1$ and $R_2$ are each independently selected from H, alkyl, preferably alkyl of from 1 to 6 carbon atoms, aryl, preferably aryl of from 3 to 14 carbon atoms, $OR_3$ and $SO_2R_4$; n is a numeral of from 2 to 6, preferably 2 or 3; W and Y are each independently selected from $OR_3$, and $SO_2R_4$; and $R_3$ and $R_4$, are each independently selected from H, alkyl, preferably alkyl of from 1 to 6 carbon atoms, and aryl, preferably aryl of from 3 to 14 carbon atoms. As examples of such corrosion-inhibiting co-solvents there may be mentioned, for example, ethylene glycol, propylene glycol and glycerol and the like. If the required polar organic solvent component of the cleaning composition is not a saturated alcohol within the above-mentioned formula, such a saturated alcohol may be present as a co-solvent. The co-solvents may be present in the composition in an amount of from 0 to about 80 wt %, preferably from about 1 to about 50 wt %, most preferably from about 1 to 30 wt %.

The compositions of this invention may also contain other corrosion-inhibiting agents, preferably aryl compounds containing two or more OH, $OR_5$ and/or $SO_2R_6$ groups bonded directly to the aromatic ring, where $R_5$, and $R_6$ are each independently alkyl, preferably alkyl of from 1 to 6 carbon atoms, or aryl, preferably aryl of from 6 to 14 carbon atoms. As examples of such preferred corrosion-inhibiting agents there may be mentioned catechol, pyrogallol, gallic acid, resorcinol and the like. Such other corrosion-inhibiting agents may be present in an amount of from 0 to about 15 wt %, preferably from about 0.1 to about 10 wt %, most preferably from about 0.5 to about 5 wt %.

Organic or inorganic chelating or metal complexing agents are not required, but offer substantial benefits, such as for example, improved product stability. Examples of suitable chelating or complexing agents include but are not limited to trans-1,2-cyclohexanediamine tetraacetic acid (CyDTA), ethylenediamine tetraacetic acid (EDTA), stannates, pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties [e.g. ethylenediamine tetra(methylene phosphonic acid) (EDTMP), diethylenetriamine penta(methylene phosphonic acid), triethylenetetramine hexa(methylene phosphonic acid). The chelating agent will be present in the composition in an amount of from 0 to about 5 wt %, preferably from about 0.1 to about 2 wt %. Metal chelating or complexing agents of various phosphonates, such as ethylenediamine tetra(methylene phosphonic acid) (EDTMP) offer much improved stabilization of the cleaning compositions of the cleaning compositions of this invention when they are combined with oxidizing agents at acidic and alkaline conditions and thus are generally preferred.

Optionally other metal corrosion inhibitors, such as benzotriazole, may be employed in an amount of from 0 to about 5 wt %, preferably from about 0.1 to 2 wt %.

The cleaning compositions optionally may also contain surfactants, such as for example dimethyl hexynol (Surfynol61), ethoxylated tetramethyl decynediol (Surfynol465), polytetrafluoroethylene cetoxypropylbetaine (Zonyl FSK), Zonyl FSH and the like. The surfactant will generally be present in an amount of from 0 to about 5 wt %, preferably 0.1 to about 3 wt %.

The cleaning compositions may also optionally contain fluoride compounds in cleaning composition, such as for example, tetramethylammonium fluoride, tetrabutylammonium fluoride, and ammonium fluoride. Other suitable fluorides include, for example fluoroborates, tetrabutylammonium fluoroborates, aluminum hexafluorides, antimony fluoride and the like. The fluoride components will be present in an amount of from 0 to 10 wt %, preferably from about 0.1 to 5 wt %.

As stated earlier, the cleaning compositions of this invention can be employed in combination with oxidizing agents, as discussed hereinafter, to form additional cleaning and stripping compositions. Such compositions can contain any oxidizing agent suitable for use in microelectronic cleaning compositions. As examples of such oxidizing agents there may be mentioned, for example, peroxides, particularly hydrogen peroxide, molecular adducts of peroxyhydrates from hydrogen peroxides and oxyacids, zirconyl acetate and azo compounds, e.g., sodium percarbonate, sodium perborates, as well as periodates ($IO_4^-$), perborates, permanganates ($MnO_4^-$), hydrogen persulfates, persulfates and alkyloxyhalides, for example t-BuOCl. Other peroxy compounds from substitution reactions of $H_2O_2$ and organic molecules may be employed but are less preferred. Examples include alkylperoxides, peroxyacids, diacyl peroxides and ketone peroxides. Similar substitution products of $H_2O_2$ with inorganic molecules, such as peroxysulfuric acid, may also be employed. When the compositions of this invention are combined with an oxidizing agent the oxidizing agent is employed in the resulting cleaning compositions in an amount of from about 0.1 to about 30 wt %, preferably from about 0.1 to about 5 wt %, and most preferably in an amount of from about 0.5 to about 5 wt %. The preferred oxidizing agent is hydrogen peroxide ($H_2O_2$), preferably employed as a 3 to 30% aqueous solution.

Examples of cleaning composition of this invention set forth in the following Tables 1 to 4.

In the following Tables the abbreviations employed are as follows.

TMAH=25% Tetramethylammmonium hydroxide
HEP=1-(2hydroxyethyl)-2-pyrolidinone
CyDTA=trans-1,2-cyclohexanediamine tetraacetic acid
DMPD=dimethylpiperidone
SFL=sulfolane
EG=ethylene glycol
CAT=catechol
EDTMP=ethylenediamine tetra(methylene phosphonic acid)
$NH_4OH$=ammonium hydroxide
CH=choline hydroxide
Water=additonal water over water from aqueous solution of components.

TABLE 1

Compositions/Parts by Weight

| Component | A | B | C | D | E | F |
|---|---|---|---|---|---|---|
| 25% TMAH | 25 | 17.5 | 10 | 2.5 | 2 | 9 |
| HEP | | | | | | |
| SFL | 300 | 150 | | 30 | 50 | |
| CyDTA | 2.3 | | 0.9 | 0.23 | 0.19 | 1.15 |
| EDTMP | | 1.8 | | | | |
| DMPD | | | 120 | | | |
| EG | | 30 | | 15 | | 200 |
| CAT | | | | 3 | | |
| 29% $NH_4OH$ | | | | | | |
| 20% CH | | | | | | |
| $H_2O$ | 75 | 60 | 60 | 7.5 | 12.5 | |

TABLE 2

Compositions/Parts by Weight

| Component | G | H | I | J | K | L |
|---|---|---|---|---|---|---|
| 25% TMAH | 25 | 25 | 20 | 25 | 17.5 | 17.5 |
| HEP | | | | | | |
| SFL | 300 | 300 | 300 | 300 | 150 | 150 |
| CyDTA | 3 | 3 | 2.5 | 1.5 | | |
| EDTMP | | | | | 1.8 | 1.8 |
| DMPD | | | | | | |
| EG | 5 | 30 | | | 40 | 20 |
| CAT | | | | | | |
| 29% $NH_4OH$ | | | | | | |
| 20% CH | | | | | | |
| $H_2O$ | 35 | 45 | 45 | 45 | 50 | 50 |

TABLE 3

Compositions/Parts by Weight

| Component | M | N | O | P | Q | R |
|---|---|---|---|---|---|---|
| 25% TMAH | 2.5 | | | | | 3.1 |
| HEP | | | | | | |
| SFL | 30 | 50 | 50 | 50 | 50 | 74 |
| CyDTA | 0.23 | 0.39 | | 0.39 | | 0.28 |
| EDTMP | | | 0.6 | | 0.6 | |
| DMPD | | | | | | |
| EG | 15 | | | | | |
| CAT | 3 | 3.5 | 3.5 | | | |
| 29% $NH_4OH$ | | 1.4 | 1.9 | 1.4 | 1.9 | |
| 20% CH | | | | | | |
| $H_2O$ | 7.5 | 12.5 | 20 | 12.5 | 20 | 40 |

TABLE 4

| Component | Compositions/Parts by Weight | | | |
|---|---|---|---|---|
| | S | T | U | V |
| 25% TMAH | 7.5 | 17.5 | 6.25 | 7.5 |
| HEP | | | | 75 |
| SFL | | 75 | | |
| CyDTA | 1.2 | 0.8 | 0.6 | 1.2 |
| EDTMP | | | | |
| DMPD | 75 | | | |
| EG | | | | |
| CAT | | | | |
| 29% NH$_4$OH | | | | |
| 20% CH | | | 12 | |
| H$_2$O | 25 | 25 | 25 | 25 |

The copper etch rate for cleaning compositions of this invention are demonstrated by the etch rate data in the following Table 5. The etch rate was determined for Compositions A, B (modified) and E of Table 1 utilizing the following test procedure.

Pieces of copper foil of approximately 13×50 mm were employed. The weight of the foil pieces was measured. After cleaning the foil pieces with 2-propanol, distilled water and acetone and the foil pieces are dried in a drying oven. The cleaned, dried foil pieces were then placed in loosely capped bottles of preheated cleaning compositions of the invention and placed in a vacuum oven for a period of from two to twenty-four hours at the indicated temperature. Following treatment and removal from the oven and bottles, the cleaned foils were rinsed with copious amounts of distilled water and dried in a drying oven for about 1 hour and then permitted to cool to room temperature, and then the etch rate determined based on weight loss or weight change.

TABLE 5

| Composition From Table 1 | Cu Etch Rate at 55° C. (Å/min) | Cu Etch Rate at 65° C. (Å/min) |
|---|---|---|
| A | 6 | 6 |
| B + 25% TMAH (62.5:5) | | 3 |
| E | 4 | 3 |

The interlayer dielectric (ILD) etch rates for Compositions A and B of Table 1 of this invention against various dielectrics were evaluated by the following test procedure.

The film thickness of the wafer pieces is measured using a Rudolph Interferometer. The wafer pieces (with ILD material deposited on silicon wafers) were immersed in the designated cleaning compositions at the indicated temperature for 30 minutes, followed by rinsing with de-ionized water and drying under nitrogen flow/stream. The thickness was then measured again following the treatment and the etch rates were then calculated based on the change in film thickness, which are produced by the indicated treatments.

The IDL etch rates with Composition A were as set forth in Table 6 and the IDL etch rates with Composition B were as set forth in Table 7.

TABLE 6

| Dielectric | Etch Rate @70° C. (Å/min) |
|---|---|
| Carbon doped oxide (CDO) | 5 |
| Silicon nitride (SiN) | 3 |
| Tetraethylorthosilicate (pTEOS) | 1.5 |
| SiLK ™ organic polymer | — |
| Fluorinated silicate glass (FSG) | <1 |
| Coral ™ carbon doped oxide | 18 |

TABLE 7

| Dielectric | Etch Rate @70° C. (Å/min) |
|---|---|
| Carbon doped oxide (CDO) | 1.5 |
| Silicon nitride (SiN) | 4 |
| Tetraethylorthosilicate (pTEOS) | 1 |
| SiLK ™ organic polymer | <1 |
| Fluorinated silicate glass (FSG) | <1 |
| Coral ™ carbon doped oxide | 3 |

The cleaning capability of compositions of this invention is illustrated by the following test in which a microelectronic structure that comprised a wafer of the following structure, namely a post trench etched sample of photoresist/anti-reflective coating (ARC)/porous carbon doped oxide, was immersed in a cleaning solution of Composition A of Table 1 at 50° C. for 20 minutes, then water rinsed, dried and the cleaning determined by SEM Inspection. The results were that the composition cleaned most of the ARC with only minor etching of porous carbon doped oxide.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

I claim:

1. A silicate free cleaning composition that is stable in strong alkaline conditions of pH >9 and in the presence of $H_2O_2$ and capable of cleaning photoresist and residues from microelectronic substrates having copper metallization and a porous or non-porous low-κ or high-κ dielectric, said cleaning composition being stable when in the presence of hydrogen peroxide oxidizing agent, said composition consisting essentially of:

from about 10 to about 90% by weight of a polar organic solvent having hydrogen bonding capability and minimally or non-reactive with an oxidizing agent, wherein the polar organic solvent is selected from the group consisting of dimethylpiperidone, sulfones, and sulfolanes;

from about 0.1 to about 10% by weight of a member selected from the group consisting of a tetraalkylammonium hydroxide, choline hydroxide, sodium hydroxide, and potassium hydroxide;

from about 10 to about 60% water; and from about 0.1 to about 5% by weight a chelating or metal complexing agent selected from the group consisting of trans-1,2-cyclohexanediamine tetraacetic acid, ethane-1-hydroxy-1,1-diphosphonate and ethylenediamine tetra(methylene phosphonic acid).

2. A cleaning composition according to claim 1 wherein the polar organic solvent is sulfolane and the chelating or metal complexing agent is trans-1,2-cyclohexanediamine tetraacetic acid.

3. The cleaning composition according to claim 2 consisting essentially of sulfolane, tetramethylammonium hydroxide, trans-1,2-cyclohexanediamine tetraacetic acid and water.

4. A process for cleaning photoresist or residue from a microelectronic substrate, the process comprising contacting the substrate with a cleaning composition for a time sufficient to clean the photoresist and residue from the substrate, wherein the cleaning composition consists essentially of a composition of claim 2.

5. A process for cleaning photoresist or residue from a microelectronic substrate, the process comprising contacting the substrate with a cleaning composition for a time sufficient to clean the photoresist and residue from the substrate, wherein the cleaning composition consists essentially of a composition of claim 3.

6. The cleaning composition according to claim 1 consisting essentially of dimethylpiperidone, trans-1,2-cyclohexanediamine tetraacetic acid, tetramethylammonium hydroxide and water.

7. A process for cleaning photoresist or residue from a microelectronic substrate, the process comprising contacting the substrate with a cleaning composition for a time sufficient to clean the photoresist and residue from the substrate, wherein the cleaning composition consists essentially of a composition of claim 1.

8. A process for cleaning photoresist or residue from a microelectronic substrate, the process comprising contacting the substrate with a cleaning composition for a time sufficient to clean the photoresist and residue from the substrate, wherein the cleaning composition consists essentially of a composition of claim 6.

9. A silicate free cleaning composition that is stable in strong alkaline conditions of pH >9 and in the presence of $H_2O_2$ and capable of cleaning photoresist and residues from microelectronic substrates having copper metallization and a porous or non-porous low-κ or high-κ dielectric, said cleaning composition being stable when in the presence of hydrogen peroxide oxidizing agent, said composition consisting of:

from about 10 to about 90% by weight of a polar organic solvent having hydrogen bonding capability and minimally or non-reactive with an oxidizing agent, wherein the polar organic solvent is selected from the group consisting of dimethylpiperidone, sulfones, and sulfolanes;

from about 0.1 to about 10% by weight of a member selected from the group consisting of a tetraalkylammonium hydroxide, choline hydroxide, sodium hydroxide, and potassium hydroxide;

from about 10 to about 60% water; and from about 0.1 to about 5% by weight a chelating or metal complexing agent selected from the group consisting of trans-1,2-cyclohexanediamine tetraacetic acid, ethane-1-hydroxy-1,1-diphosphonate and ethylenediamine tetra(methylene phosphonic acid).

10. The cleaning composition according to claim 9 consisting of sulfolane, tetramethylammonium hydroxide, trans-1,2-cyclohexanediamine tetraacetic acid and water.

11. The cleaning composition according to claim 9 consisting of dimethylpiperidone, trans-1,2-cyclohexanediamine tetraacetic acid, tetramethylammonium hydroxide and water.

12. A process for cleaning photoresist or residue from a microelectronic substrate, the process comprising contacting the substrate with a cleaning composition for a time sufficient to clean the photoresist and residue from the substrate, wherein the cleaning composition consists of a composition of claim 9.

13. A process for cleaning photoresist or residue from a microelectronic substrate, the process comprising contacting the substrate with a cleaning composition for a time sufficient to clean the photoresist and residue from the substrate, wherein the cleaning composition consists of a composition of claim 10.

14. A process for cleaning photoresist or residue from a microelectronic substrate, the process comprising contacting the substrate with a cleaning composition for a time sufficient to clean the photoresist and residue from the substrate, wherein the cleaning composition consists of a composition of claim 11.

* * * * *